(12) United States Patent
Shinada

(10) Patent No.: US 9,694,703 B2
(45) Date of Patent: Jul. 4, 2017

(54) CHARGING DEVICE

(71) Applicant: Komatsu Ltd., Tokyo (JP)

(72) Inventor: Youhei Shinada, Oyama (JP)

(73) Assignee: Komatsu Ltd., Tokyo (JP)

( * ) Notice: Subject to any disclaimer, the term of this patent is extended or adjusted under 35 U.S.C. 154(b) by 0 days.

(21) Appl. No.: 14/124,356

(22) PCT Filed: Oct. 15, 2013

(86) PCT No.: PCT/JP2013/077978
§ 371 (c)(1),
(2) Date: Dec. 6, 2013

(87) PCT Pub. No.: WO2015/015659
PCT Pub. Date: Feb. 5, 2015

(65) Prior Publication Data
US 2016/0137084 A1 May 19, 2016

(30) Foreign Application Priority Data
Aug. 2, 2013 (WO) .................. PCT/JP2013/071066

(51) Int. Cl.
*B60L 11/18* (2006.01)
*H05K 7/20* (2006.01)
*H02J 7/00* (2006.01)

(52) U.S. Cl.
CPC ....... *B60L 11/1824* (2013.01); *B60L 11/1816* (2013.01); *H02J 7/0008* (2013.01);
(Continued)

(58) Field of Classification Search
CPC .................................................. H02J 7/0042
See application file for complete search history.

(56) References Cited

U.S. PATENT DOCUMENTS 5,793,608 A * 8/1998 Winick ..................... G06F 1/20
257/E23.099
6,477,965 B2 * 11/2002 Yamaguchi ............... B60L 9/24
105/59

(Continued)

FOREIGN PATENT DOCUMENTS

CN 1313205 A 9/2001
CN 201628914 U 11/2010
(Continued)

OTHER PUBLICATIONS

JP2011211773—Power supply Apparatus translation, Nagami et al, Oct. 2011.*

(Continued)

*Primary Examiner* — Drew A Dunn
*Assistant Examiner* — Tynese McDaniel
(74) *Attorney, Agent, or Firm* — Locke Lord LLP; Howard M. Gitten

(57) ABSTRACT

A charging device includes: a housing; a heat radiation member storage room to which a part of electric parts in a power conversion unit is attached, and which houses a heat sink including fins; an electric parts storage room housing other electric parts of the power conversion unit and a control unit; a first suction port introducing a gas into the heat radiation member storage room and a first exhaust port discharging the gas; a second suction port introducing the gas into the electric parts storage room and a second exhaust port discharging the gas; a first fan introducing the gas into the heat radiation member storage room and a second fan introducing the gas into the electric parts storage room; a suction-side waterproof cover that covers the first and second ports; and an exhaust-side waterproof cover covering the first and second exhaust ports.

7 Claims, 10 Drawing Sheets

(52) U.S. Cl.
CPC ........ *H02J 7/0047* (2013.01); *H05K 7/20136* (2013.01); *H05K 7/20909* (2013.01)

(56) References Cited

U.S. PATENT DOCUMENTS

| | | | | |
|---|---|---|---|---|
| 8,243,447 | B2* | 8/2012 | Fujiki | H05K 7/20909 165/185 |
| 8,619,424 | B2 | 12/2013 | Kishimoto et al. | |
| 2001/0003416 | A1* | 6/2001 | Kajiura | B60L 11/1825 320/109 |
| 2006/0012947 | A1* | 1/2006 | Nakata | H02B 1/28 361/600 |
| 2010/0039771 | A1* | 2/2010 | Marchand | H05K 7/20909 361/694 |
| 2011/0090643 | A1* | 4/2011 | Sun | G06F 1/181 361/679.48 |
| 2011/0222243 | A1 | 9/2011 | Nagami et al. | |
| 2012/0063089 | A1* | 3/2012 | Kishimoto | H05K 7/20909 361/697 |

FOREIGN PATENT DOCUMENTS

| | | |
|---|---|---|
| CN | 102195455 A | 9/2011 |
| CN | 102404979 A | 4/2012 |
| EP | 1856955 A1 | 11/2007 |
| JP | 63-86499 A | 4/1988 |
| JP | 2001-244676 A | 9/2001 |
| JP | 2001-258263 A | 9/2001 |
| JP | 2005-124322 A | 5/2005 |
| JP | 2008-253073 A | 10/2008 |
| JP | 2011-211773 A | 10/2011 |
| JP | 2011211773 * | 10/2011 ............. H02M 1/00 |
| JP | 2012-060027 A | 3/2012 |

OTHER PUBLICATIONS

International Search Report dated Nov. 5, 2013, issued for PCT/JP2013/077978.

* cited by examiner

CHARGING DEVICE

FIELD

The present invention relates to a charging device for charging a battery mounted on a battery-type working vehicle.

BACKGROUND

For example, there are working vehicles on which a motor used for traveling is mounted, and which supplies power to the motor from a battery to travel. It is necessary for such a working vehicle to charge the battery with a charging device when the power stored in the battery has been consumed. For example, Patent Literature 1 discloses a secondary battery charging system in which a battery charger for charging a secondary battery mounted on a working vehicle is provided separately from the working vehicle.

CITATION LIST

Patent Literature

Patent Literature 1: Japanese Laid-open Patent Publication No. 2011-211773

SUMMARY

Technical Problem

By the way, if the charging device for charging the battery mounted on the working vehicle is separately prepared from the working vehicle, there is a possibility that a liquid such as water, and dust enter an interior of the charging device. Further, when the battery is quickly charged, the current to be given to the battery becomes large. As a result, the calorific value of the charging device becomes large, and thus it is necessary to cool the charging device.

An objective of the present invention is to secure dustproof and waterproof performance, and cooling performance of a charging device disposed outside a battery-type working vehicle and charging a battery mounted on the working vehicle.

Solution to Problem

According to the present invention, a charging device for charging a battery, the charging device comprises: a housing including a bottom part, an upper part facing the bottom part, a side part connecting the upper part and the bottom part, and housing a power conversion unit configured to convert alternating-current power into direct-current power to supply the direct-current power to the battery, and a control unit configured to control the power conversion unit; a heat radiation member storage room to which a part of a plurality of electric parts included in the power conversion unit is attached, the heat radiation member storage room housing a heat radiation member including a plurality of fins; an electric parts storage room housing other electric parts of the power conversion unit and the control unit; a first suction port provided in the housing and configured to introduce a gas into the heat radiation member storage room, and a first exhaust port provided in the housing and configured to exhaust the introduced gas; a second suction port provided in the housing and configured to introduce the gas into the electric parts storage room, and a second exhaust port provided in the housing and configured to exhaust the introduced gas; and a first fan configured to introduce the gas into the heat radiation member storage room, and a second fan configured to introduce the gas into the electric parts storage room, wherein the first suction port, the second suction port, the first exhaust port, and the second exhaust port open to the side part, the second suction port opens to a side of the upper part than the first suction port, and the second exhaust port opens to a side of the upper part than the first exhaust port.

In the present invention, it is preferable that the charging device, further comprises: an attachable/detachable suction-side filter provided at the second suction port; and an attachable/detachable exhaust-side filter provided at the second exhaust port.

In the present invention, it is preferable that the plurality of fins included in the heat radiation member extends toward a direction into which the gas flows, and the charging device further includes: an inlet-side mesh provided at an inlet side of the first suction port, and having a smaller opening than a pitch between the adjacent fins; a suction-side partition member provided between a suction-side waterproof cover covering the first suction port and the second suction port and the housing, and partitioning the first suction port and the second suction port and introducing the gas that passed through the first mesh into the first suction port; an outlet-side mesh provided at an outlet side of the first exhaust port, and having a smaller opening than a pitch between the adjacent fins; and an exhaust-side partition member provided between an exhaust-side waterproof cover covering the first exhaust port and the second exhaust port and the housing, and partitioning the first exhaust port and the second exhaust port and introducing the gas having discharged through the second exhaust port into the second mesh.

In the present invention, it is preferable that end parts of the fins included in the heat radiation member face the bottom part, and a position at which the part of the electric parts is attached is at a side of the upper part than the end parts of the fins.

In the present invention, it is preferable that the other electric parts are arranged in an interior of the electric parts storage room with a predetermined pitch between the other electric parts and the bottom part.

In the present invention, it is preferable that the housing includes an in-housing partition member that partitions the electric parts storage room into a side of the upper part and a side of the lower part, and the second suction port and the second exhaust port open to both of the upper part side and the lower part side of the electric parts storage room, with the in-housing partition member in-between.

In the present invention, it is preferable that the second fan introduces the gas into both of the upper part side and the lower part side of the electric parts storage room.

In the present invention, it is preferable that the first fan is provided at the first exhaust port and sucks the gas from the heat radiation member storage room, and the second fan is provided at the second exhaust port and sucks the gas from the electric parts storage room.

The present invention can secure dustproof and waterproof performance, and cooling performance of a charging device disposed outside a battery-type working vehicle and charging a battery mounted on the working vehicle.

DESCRIPTION OF EMBODIMENTS

Embodiments for implementing the present invention (embodiments) will be described in detail with reference to the drawings.

Figure 1:
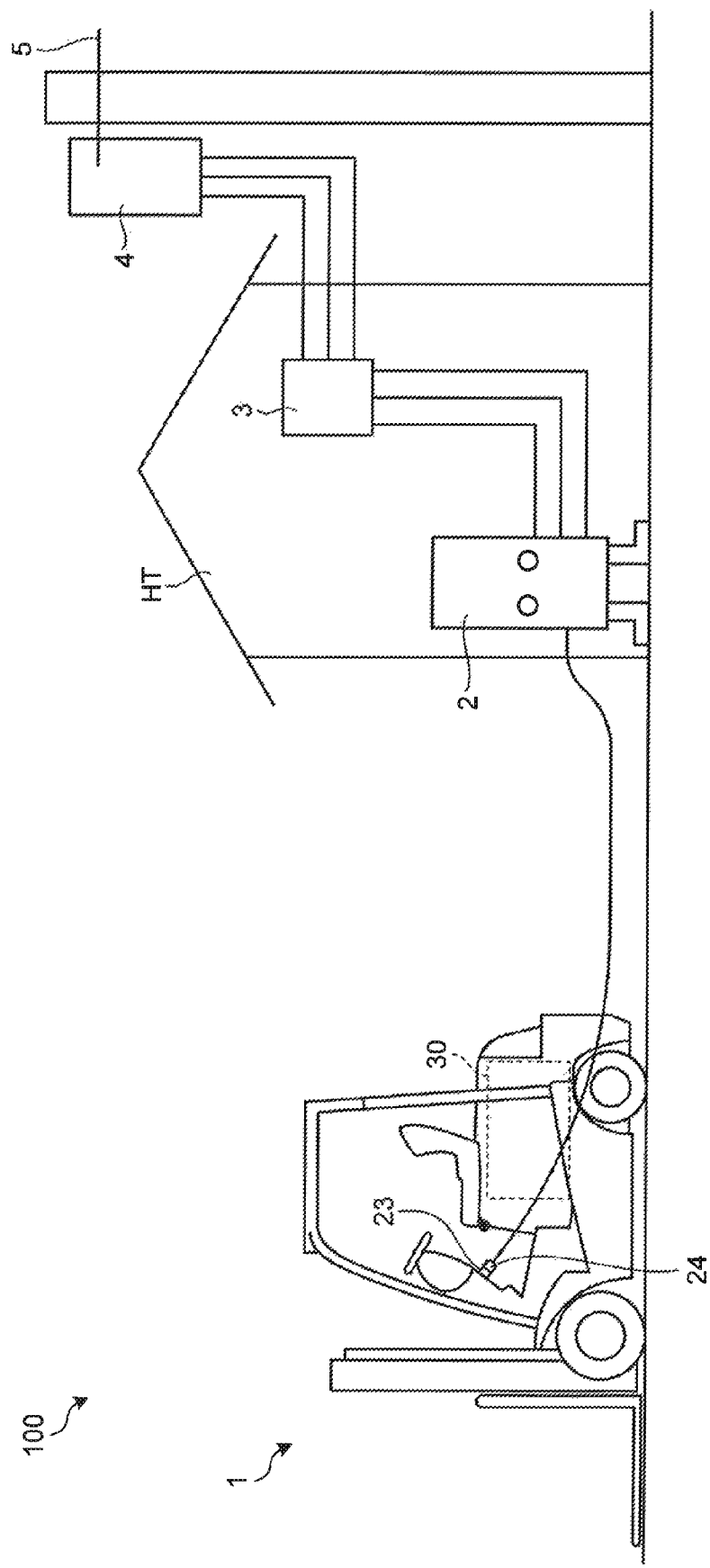
FIG. 1 is a diagram illustrating a working vehicle charging system according to the present embodiment.

FIG. 1 is a diagram illustrating a working vehicle charging system according to the present embodiment. In the present embodiment, a battery-type forklift 1 will be described as an example of a working vehicle. However, the working vehicle is not limited to the battery-type forklift 1. For example, the working vehicle may be a wheel loader, an excavator, or the like driven by the power from a battery or the power obtained from a generator driven by an engine or the like.

A working vehicle charging system 100 includes a battery-type forklift 1 and a charging device 2. The battery-type forklift 1 is a battery-type working vehicle provided with a battery 30 as a working vehicle battery and at least one motor driven by the power supplied from the battery 30. The at least one motor is, for example, a motor for causing the battery-type forklift 1 to travel. The charging device 2 is a stationary device disposed in a building HT or under the eaves of the building HT. A three-phase alternating current is supplied to the charging device 2 from a switch board 3 in the building HT. The charging device 2 can quickly charge the battery 30 of the battery-type forklift 1. Alternating-current power is supplied to the switch board 3 from a pole transformer 4, for example. The alternating-current power is supplied to the pole transformer 4 from a substation through a power line 5. In the battery-type forklift 1, a charging device-side connector 24 of the charging device 2 is connected to a charging connector 23 during a rest time, for example, and the battery 30 is charged. In a case of using a rest time, the battery 30 is quickly charged.

Figure 2:
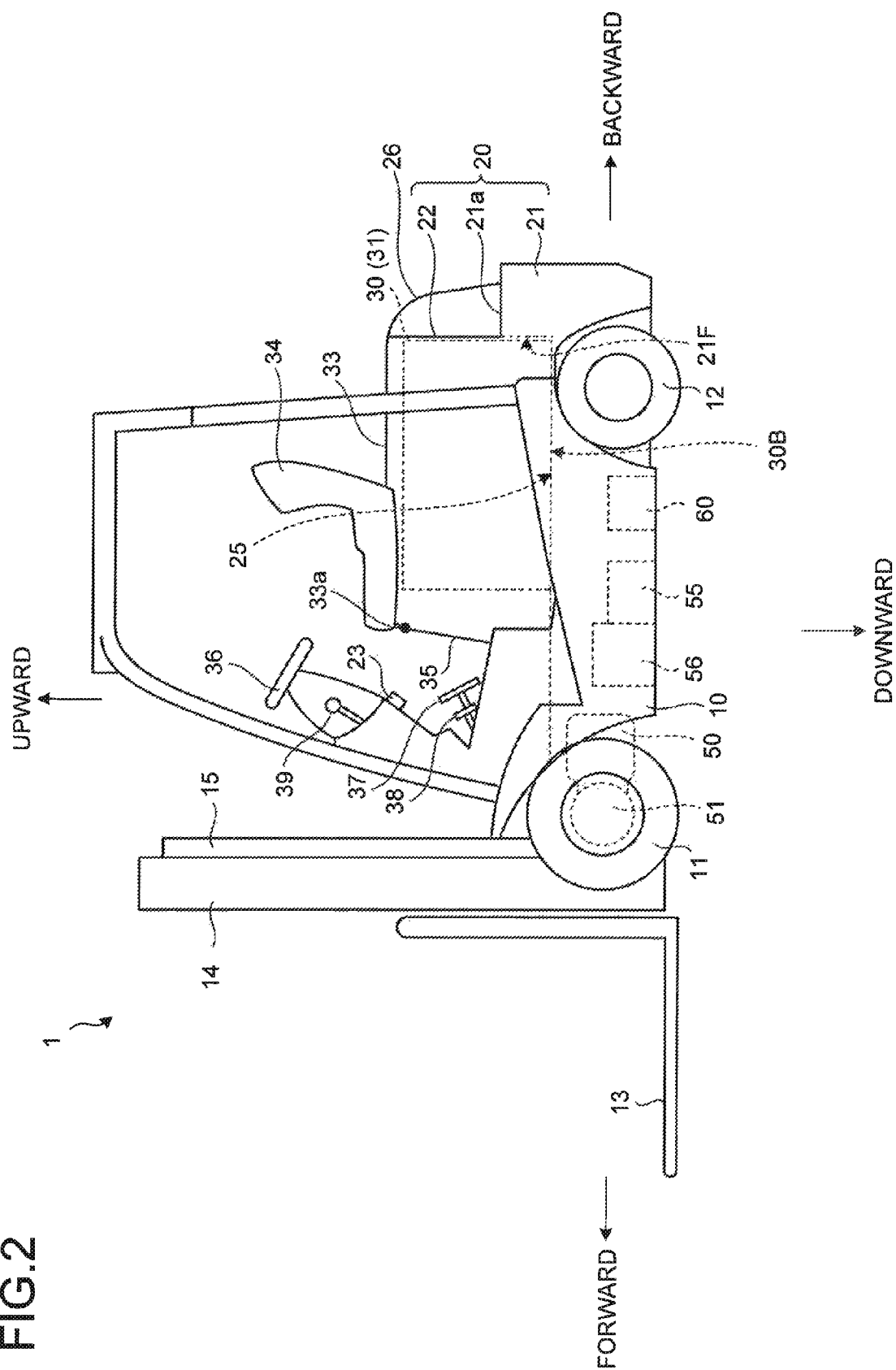
FIG. 2 is a side view illustrating a state of a battery-type forklift according to the present embodiment as viewed from the left side.
Figure 3:
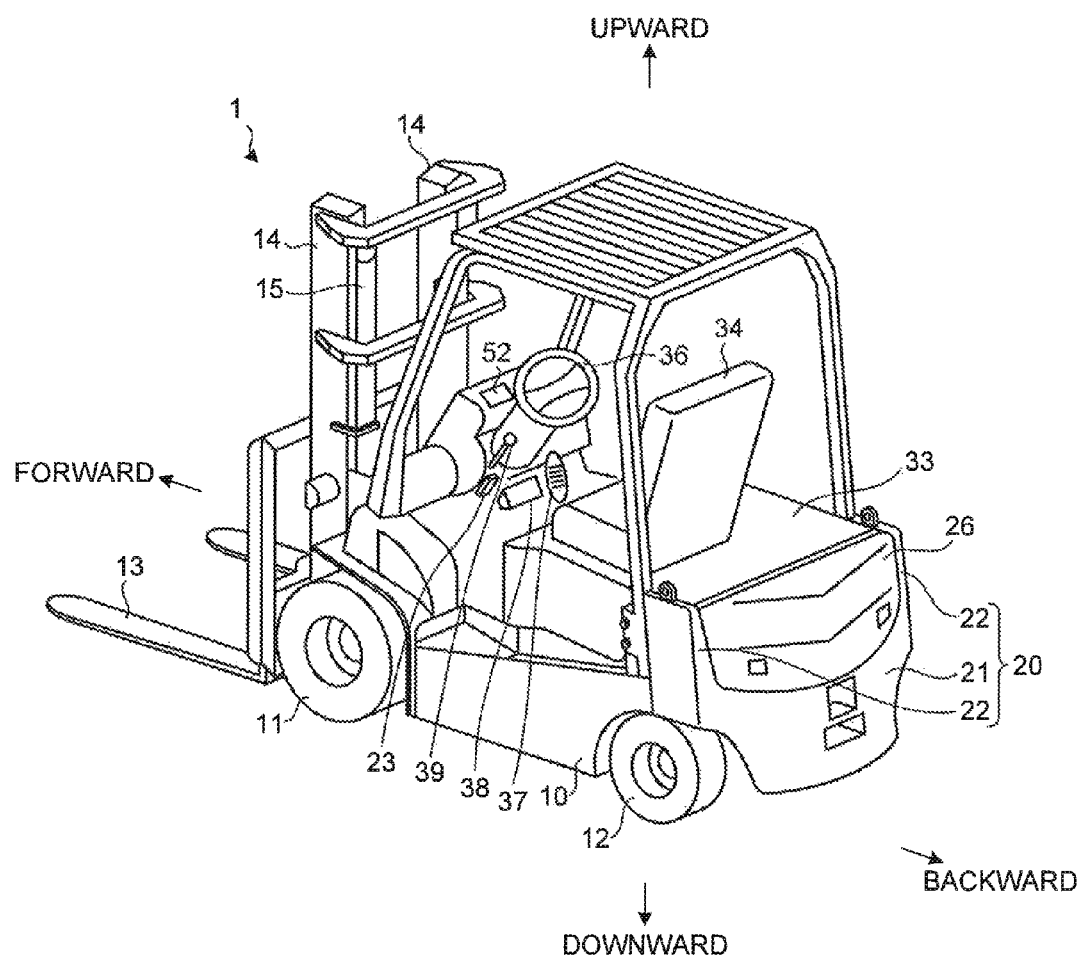
FIG. 3 is a perspective view illustrating a state of the battery-type forklift according to the present embodiment as viewed from a rear-left oblique-upper side.

FIG. 2 is a side view illustrating a state of the battery-type forklift according to the present embodiment as viewed from the left side. FIG. 3 is a perspective view illustrating a state of the battery-type forklift according to the present embodi-ment as viewed from a rear-left oblique-upper side. Hereinafter, in the battery-type forklift 1, the side where a fork 13 is provided is a forward side, and the side where a counter weight 20 is provided is a backward side. In a case where the working vehicle is not a battery-type forklift, the side from a driver's seat 34 toward a handle 36 as an operation device is the forward side, and the side from the handle 36 toward the driver's seat 34 is the backward side. The operation device includes an operation lever for operating a working machine in an excavator, a wheel loader, or the like, other than the handle 36 used for steering the working vehicle.

In the present embodiment, right and left means right and left with respect to the front. A right and left direction is a width direction of a vehicle body 10 as a main body of the working vehicle. An upward side is a side perpendicular to a plane (ground plane) that is in contact with at least three of front wheels 11 and rear wheels 12, and is a side from the ground plane toward a rotation center axis of the front wheels 11 or of the rear wheels 12. A downward side is a side from the rotation center axis of the front wheels 11 or of the rear wheels 12 toward the ground plane. An axis toward a front and rear direction of the vehicle body 10 and passing through a width direction center of the vehicle body 10 is a front and rear axis, and an axis perpendicular to the front and rear axis, parallel with the disposition plane, and toward the right and left direction of the vehicle body 10 is a right and left axis. An axis toward an up and down direction of the vehicle body 10 is an up and down axis. The up and down axis is perpendicular to both of the front and rear axis and the right and left axis. Hereinafter, a plane view refers to a state as viewed from an upward side.

<Overall Configuration of Battery-Type Forklift 1>

The battery-type forklift 1 includes the front wheels 11 respectively provided at forward corner portions of the vehicle body 10, and the rear wheels 12 provided at backward corner portions of the vehicle body 10. The battery-type forklift 1 travels by the front wheels 11 being driven by a traveling motor 50 provided at a reward side of the front wheels 11. To be specific, an output of the traveling motor 50 is transmitted to both of the front wheels 11 and 11 through a power transmission device 51 having a deceleration function.

In the present embodiment, as the traveling motor 50, a permanent magnet-type (PM) motor, that is, a motor in which a rotor has a permanent magnet can be used, for example. When the PM-type motor is used as the traveling motor 50, a surface permanent magnet-type (SPM) motor or an interior permanent magnet-type (IPM) motor may be employed.

The fork 13 for loading/unloading or moving a load is provided at a forward part of the vehicle body 10. The fork 13 is supported by a mast 14 provided along the up and down direction. The fork 13 moves up and down along the mast 14 by driving of a mast cylinder 15 provided between the fork 13 and the mast 14. Although not illustrated in the drawing, a lower end portion of the mast 14 is rotatably attached to the vehicle body 10 around the right and left axis. Further, the mast 14 includes a tilt cylinder (not illustrated) between the mast 14 and the vehicle body 10. The mast 14 can take a forward-bent posture or a backward-bent posture with respect to the vehicle body 10 by driving of the tilt cylinder.

The counter weight 20 is provided at a rear end portion of the vehicle body 10. As described above, the battery-type forklift 1 is a counter balance-type forklift. However, the battery-type forklift 1 is not limited thereto. The counter weight 20 is a weight for balancing a weight when the fork 13 supports a load. As the counter weight 20, metal is used, for example. However, the counter weight 20 is not limited thereto. The counter weight 20 is arranged from a portion above the rear wheels 12 to a rear end portion in the vehicle body 10.

The battery-type forklift 1 includes an acceleration pedal 37, a brake pedal 38, and a traveling direction switching lever 39. The acceleration pedal 37 is an operation member that controls an output and a rotating direction of the traveling motor 50. The brake pedal 38 is an operation member for stopping the battery-type forklift 1. The traveling direction switching lever 39 is an operation member for switching the traveling direction of the battery-type forklift 1 either in a forward direction or in a backward direction. The battery-type forklift 1 includes the charging connector 23. The charging device-side connector 24 of the charging device 2 illustrated in FIG. 1 is connected to the charging connector 23 when the battery 30 is charged. A cover is attached to the charging connector 23 for waterproofing when the charging device-side connector 24 is not connected.

As illustrated in FIG. 3, the battery-type forklift 1 includes a display panel 52 as a display device at a forward part of the handle 36. The display panel 52 includes an input unit for performing various types of setting with respect to the battery-type forklift 1 and a display unit displaying information related to a state of the battery-type forklift 1 and the like. An operator of the battery-type forklift 1 performs various types of setting with respect to the battery-type forklift 1 through the display panel 52. Examples of the information related to the state of the battery-type forklift 1 to be displayed in the display unit of the display panel 52 includes, for example, a state of the battery 30, a hydraulic pressure of a hydraulic oil supplied to the mast cylinder 15, and the like. The hydraulic oil is supplied from a hydraulic pump 56 driven by a cargo motor 55 described below. An on-vehicle control device 60 controls the traveling motor 50 and the cargo motor 55.

<Structure of Charging Device 2>

Figure 4:
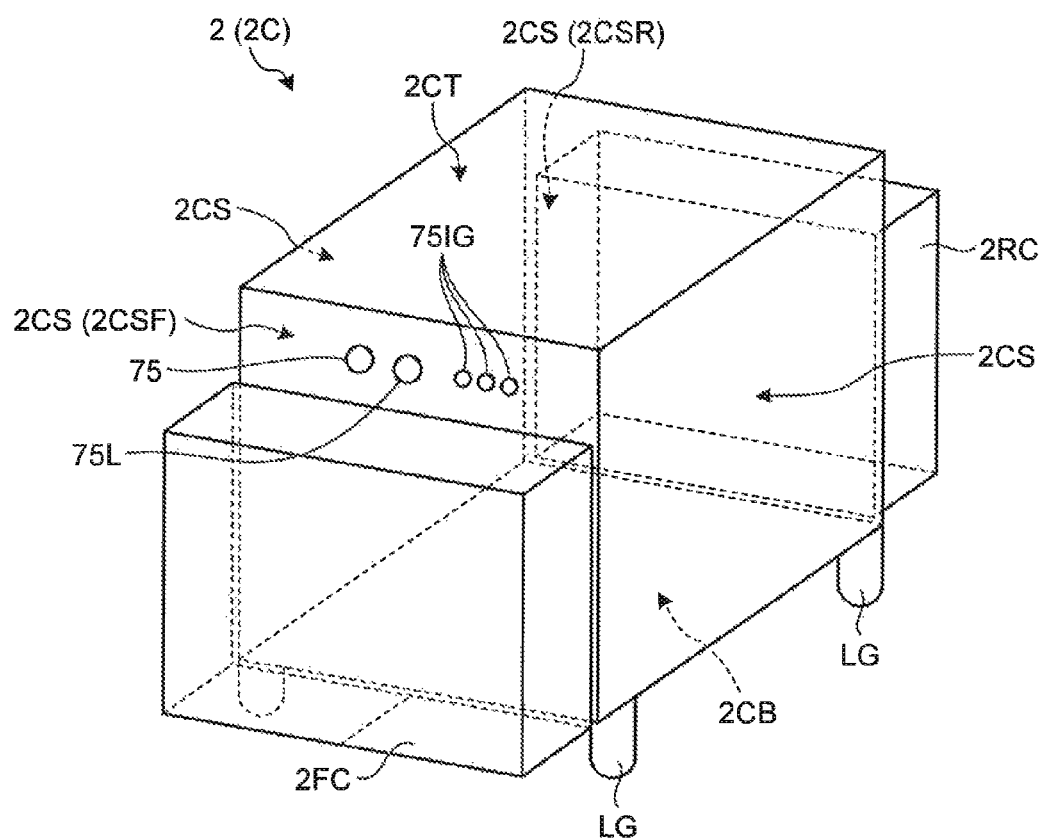
FIG. 4 is a perspective view of a charging device according to the present embodiment.
Figure 5:
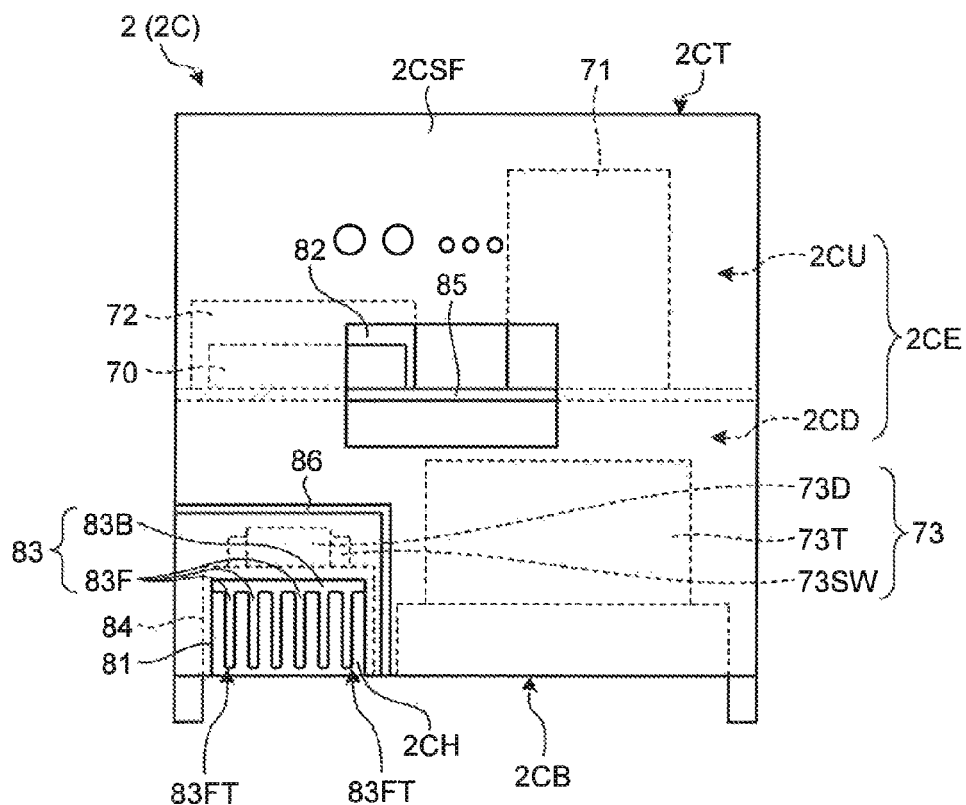
FIG. 5 is a front view illustrating the charging device in a state where a waterproof cover is removed.
Figure 6:
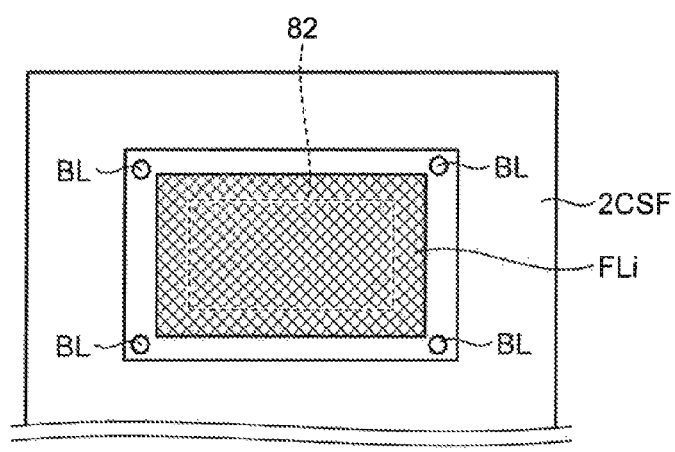
FIG. 6 is a diagram illustrating a filter.
Figure 7:
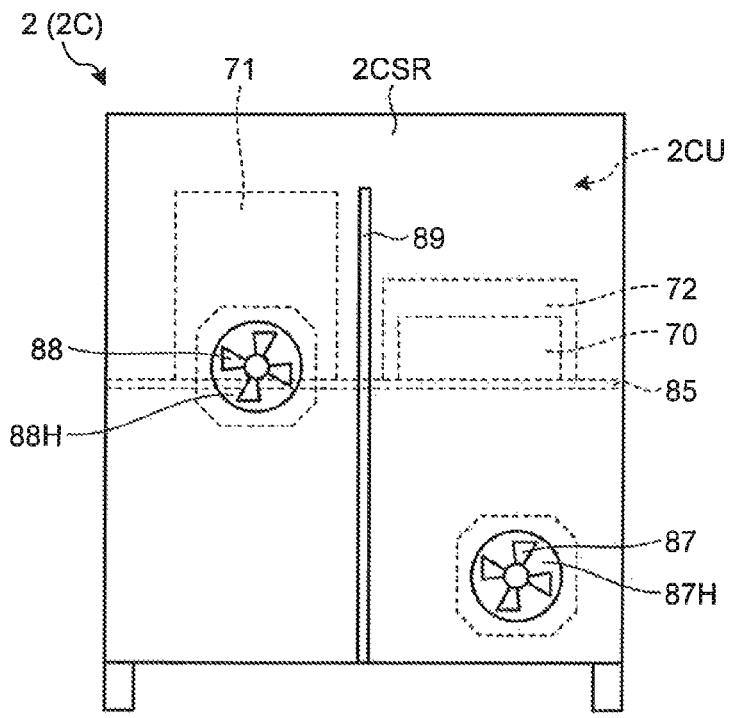
FIG. 7 is a back view illustrating the charging device in a state where the waterproof cover is removed.
Figure 8:
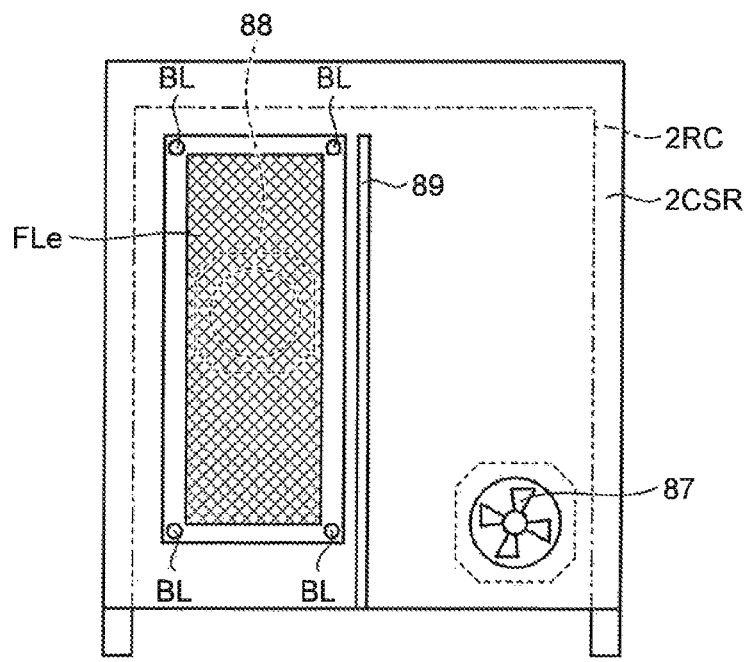
FIG. 8 is a diagram illustrating a filter.

FIG. 4 is a perspective view of the charging device according to the present embodiment. FIG. 5 is a front view illustrating the charging device in a state where a waterproof cover is removed. FIG. 6 is a diagram illustrating a filter. FIG. 7 is a back view illustrating the charging device in a state where the waterproof cover is removed. FIG. 8 is a diagram illustrating the filter. The charging device 2 has a housing 2C in which, as illustrated in FIG. 5, a control unit 70, a charging device power source 71, a startup signal generation unit 72, and a power conversion unit 73 are housed.

The control unit 70 controls the power conversion unit 73. The charging device power source 71 transforms the power supplied from the battery 30 mounted on the battery-type forklift 1 illustrated in FIG. 2 (lowering the voltage in the present embodiment), and supplies the power to the control unit 70. The startup signal generation unit 72 generates a signal for starting up the on-vehicle control device 60 illustrated in FIG. 2, and transmits the signal to a power source device of the battery-type forklift 1.

The power conversion unit 73 converts the alternating-current power into the direct-current power in order to supply the power to the battery 30. The power conversion unit 73 includes a diode 73D, a switching element 73SW, and a rectification unit 73T. The diode 73D rectifies the three-phase alternating current from the alternating-current power source. The switching element 73SW is subjected to constant current control so that the charging device 2 outputs a current having a constant value by being turned ON-OFF by the control unit 70 at a predetermined timing. The rectification unit 73T includes a transformer, and transforms and outputs the current output from the switching element 73SW (lowers the voltage in the present embodiment). The housing 2C includes a bottom part 2CB, an upper part 2CT facing the bottom part 2CB, and side parts 2CS connecting the bottom part 2CB and the upper part 2CT.

The housing 2C has a cubic shape. That is, the bottom part 2CB and the upper part 2CT have a rectangular (including a square) plane view, and four side parts 2CS connecting the bottom part 2CB and the upper part 2CT have a rectangular (including a square) plane view. In the present embodiment, all of the bottom part 2CB, the upper part 2CT, and the four side parts 2CS are flat members. A plurality of legs LG is attached to the bottom part 2CB of the housing 2C. In the housing 2C, an emergency stop switch 75, a lamp 75L, and a state display lamp 75IG are provided on one of the four side parts 2CS. The state display lamp 75IG indicates a traveling status of charging of the battery 30, for example.

The side part 2CS on which the emergency stop switch 75, the lamp 75L, and the state display lamp 75IG are provided is arranged facing the operator who operates the charging device. The side part 2CSF on which the emergency stop switch 75, the lamp 75L, and the state display lamp 75IG are provided is referred to as front side part 2CSF, for convenience. Further, a side part 2CSR facing the front side part 2CSF is referred to as back side part 2CSR, for convenience. A waterproof cover 2FC is provided at an outside of the housing 2C, to be specific, at the front side part 2CSF, and a waterproof cover 2RC is provided at the back side part 2CSR.

As illustrated in FIG. 5 an interior of the housing 2C is divided into a heat radiation member storage room 2CH and an electric parts storage room 2CE. In the present embodiment, the electric parts storage room 2CE is partitioned into an upper part 2CT side and a bottom part 2CB side of the housing by an in-housing partition member 85. The in-housing partition member 85 is a plate member. The upper part 2CT side of the housing 2C partitioned by the in-housing partition member 85 is called upper storage room 2CU, and the bottom part 2CB side is called lower storage room 2CD. Note that the in-housing partition member 85 may not be provided, and the electric parts storage room 2CE may not be partitioned into two parts. Alternatively, the electric parts storage room 2CE may be partitioned into three or more parts.

The heat radiation member storage room 2CH is a space surrounded by a duct 84 provided in the interior of the housing 2C. The heat radiation member storage room 2CH houses a heat sink 83 as a heat radiation member. A part of the electric parts from among the plurality of electric parts included in the power conversion unit 73 is attached to the heat sink 83. In the present embodiment, the diode 73D and the switching element 73SW are attached. The heat sink 83 includes a plurality of fins 83F extending in one direction and a base part 83B to which the plurality of fins 83F is attached. In the present embodiment, each of the fins 83F extends in a direction from the front side part 2CSF to the back side part 2CSR. An end part 83FT at a side opposite to the base part 83B of the plurality of fins 83F faces the bottom part 2CB.

The electric parts storage room 2CE houses the other electric parts, that is, the electric parts other than the electric parts attached to the heat sinks 83 from among the plurality of electric parts included in the power conversion unit, and the control unit 70. The electric parts other than the electric parts attached to the heat sink 83 include the transformer included in the rectification unit 73T and the like. Other than the above, the electric parts storage room 2CE houses the charging device power source 71 and the startup signal generation unit 72. The upper storage room 2CU houses the control unit 70, the charging device power source 71, and the startup signal generation unit 72. The lower storage room 2CD houses the rectification unit 73T.

As illustrated in FIG. 5, a first suction port 81 and a second suction port 82 are provided in the front side part 2CSF that is a part of the housing 2C. As described above, in the present embodiment, the first suction port 81 and the second suction port 82 are provided in the same side part of the housing 2C, that is, provided in the front side part 2CSF. In the present embodiment, the first suction port 81 and the second suction port 82 are provided one each. These ports are offset in a width direction of the housing 2C and are arranged in upper and lower parts. The width direction is a direction perpendicular to the up and down direction. By arranging the first suction port 81 and the second suction port 82 in this way, a gas can be easily introduced into a place in the housing 2C, through which the gas is to pass. Note that the number and the arrangement of the first suction port 81 and the second suction port 82 are not limited.

The first suction port 81 is an opening that introduces a gas into the heat radiation member storage room 2CH. The first suction port 81 introduces the gas into the plurality of fins 83F included in the heat sink 83. The second suction port 82 is provided in the front side part 2CSF, and is an opening that introduces the gas into the electric parts storage room 2CE. The second suction port 82 introduces the gas into both of the upper storage room 2CU and the lower storage room 2CD. Therefore, the second suction port 82 is open to both of one surface side of the in-housing partition member 85 and the other surface side of the in-housing partition member 85 across the in-housing partition member 85. With such a structure, the second suction port 82 can introduce the body into both sides of the electric parts storage room 2CE partitioned by the in-housing partition member 85. The waterproof cover 2FC illustrated in FIG. 4 covers the first suction port 81 and the second suction port 82. The waterproof cover 2FC is also appropriately referred to as suction-side waterproof cover 2FC. The suction-side waterproof cover 2FC suppresses intrusion of the rain, the snow, and the like into the interior of the housing 2C through the first suction port 81 or through the second suction port 82.

As illustrated in FIG. 6, a suction-side filter FLi is provided at the second suction port 82. The suction-side filter FLi suppresses intrusion of the dust and the like into the interior of the housing 2C through the second suction port 82. The suction-side filter FLi is attached to the front side part 2CSF that is a part of the housing 2C with a bolt BL, for example. By attaching to/detaching from the bolt BL, the suction-side filter FLi can be attached to/detached from the second suction port 82. By allowing the suction-side filter FLi to be attached to/detached from the second suction port 82, the suction-side filter FLi is clogged, or the specification of the suction-side filter FLi, for example, the fineness can be changed depending on the usage environment.

As illustrated in FIG. 5, a suction-side partition member 86 that partitions the first suction port 81 and the second suction port 82 is provided at the front side part 2CSF that is a part of the housing 2C. When the suction-side waterproof cover 2FC illustrated in FIG. 4 is attached to the front side part 2CSF, the suction-side partition member 86 is provided between the suction-side waterproof cover 2FC and the housing 2C, and partitions the first suction port 81 and the second suction port 82. The suction-side partition member 86 has an opening at the bottom part 2CB side of the housing 2C. As described below, a mesh is attached to the opening. The suction-side partition member 86 introduces the gas that has passed through the mesh into the first suction port 81.

As illustrated in FIG. 7, a first exhaust port 87H and a second exhaust port 88H are provided in the back side part 2CSR as a part of the housing 2C. As described above, in the present embodiment, the first exhaust port 87H and the second suction port 88H are provided in the same side part of the housing 2C, that is, provided in the back side part 2CSR. In the present embodiment, the first exhaust port 87H and the second exhaust port 88H are provided one each. These ports are offset in the width direction of the housing 2C, and are arranged in upper and lower parts. By arranging the first exhaust port 87H and the second exhaust port 88H in this way, the gas having introduced into the housing 2C through the first suction port 81 and the second suction port 82 can be easily discharged. Note that the number and the arrangement of the first exhaust port 87H and the second exhaust port 88H are not limited.

The first suction port 81 and the first exhaust port 87H are arranged in positions facing each other. With such a structure, the gas having introduced into the heat sink 83 through the first suction port 81 is efficiently discharged through the first exhaust port 87H.

The first exhaust port 87H is an opening that discharges the gas from the heat radiation member storage room 2CH. The first exhaust port 87H discharges the gas through the plurality of fins 83F included in the heat sink 83. The second exhaust port 88H is provided in the back side part 2CSR, and is an opening that discharges the gas from the electric parts storage room 2CE. The second exhaust port 88H discharges the gas from both of the upper storage room 2CU and the lower storage room 2CD. The waterproof cover 2RC illustrated in FIG. 4 covers the first exhaust port 87H and the second exhaust port 88H. The waterproof cover 2RC is appropriately referred to as exhaust-side waterproof cover 2RC. The exhaust-side waterproof cover 2RC suppresses intrusion of the rain, the snow, and the like into the interior of the housing 2C through the first exhaust port 87H or through the second exhaust port 88H.

As illustrated in FIG. 7, an exhaust-side filter FLe is provided at the second exhaust port 88H. The exhaust-side filter FLe suppresses intrusion of the dust and the like into the interior of the housing 2C through the second exhaust port 88H. The exhaust-side filter FLe is attached to the back side part 2CSR that is a part of the housing 2C with a bolt BL, for example. The exhaust-side filter FLe can be attached to/detached from the second exhaust port 88H by attaching/removing the bolt BL. By allowing the exhaust-side filter FLe to be attachable to/detachable from the second exhaust port 88H, the exhaust-side filter FLe is clogged, or the specification of the exhaust-side filter FLe, for example, the fineness can be changed depending on the usage environment.

A first fan 87 is provided in the first exhaust port 87H. A second fan 88 is provided in the second exhaust port 88H. The first fan 87 introduces the gas into the heat radiation member storage room 2CH. The second fan 88 introduces the gas into the electric parts storage room 2CE. To be specific, the first fan 87 sucks the gas from the heat radiation member storage room 2CH to introduce the gas into the heat radiation member storage room 2CH through the first suction port 81, and discharges the gas through the first exhaust port 87H. The second fan 88 sucks the gas from the electric parts storage room 2CE to introduce the gas into the electric parts storage room 2CE through the second suction port 82, and discharges the gas through the second exhaust port 88H. Note that the first fan 87 and the second fan 88 may send the gas to the heat radiation member storage room 2CH and to the electric parts storage room 2CE, respectively.

The body sucked through the first suction port 81 by the first fan 87 flows toward the first exhaust port 87H. As described above, the heat sink 83 illustrated in FIG. 5 is housed in the heat radiation member storage room 2CH. The plurality of fins 83F included in the heat sink 83 extends from the first suction port 81 to the first exhaust port 87H. That is, the plurality of fins 83F extends in a direction into which the gas flows within the heat radiation member storage room 2CH. With such a structure, when the first fan 87 sucks the gas, the gas flows between the adjacent fins 83F, whereby the heat sink 83 can be effectively cooled.

The charging device 2 includes the heat radiation member storage room 2CH and the electric parts storage room 2CE, and further includes the first suction port 81 that introduces the gas into the heat radiation member storage room 2CH, the first fan 87 and the first exhaust port 87H that discharges the introduced gas, the second suction port 82 that introduces the gas into the electric parts storage room 2CE, and the second fan 88 and the second exhaust port 88H that discharges the introduced gas. With such a structure, the first fan 87 can intensively cool the heat sink 83, and the second fan 88 can intensively cool the electric parts arranged in the electric parts storage room 2CE. As a result, both of the electric parts attached to the heat sink 83 and the electric parts in the electric parts storage room 2CE are efficiently cooled.

As illustrated in FIGS. 7 and 8, an exhaust-side partition member 89 that partitions the first exhaust port 87H and the second exhaust port 88H is provided at the back side part 2CSR that is a part of the housing 2C. When the exhaust-side waterproof cover 2RC illustrated in FIG. 4 is attached to the back side part 2CSR, the exhaust-side partition member 89 is provided between the exhaust-side waterproof cover 2RC and the housing 2C, and partitions the first exhaust port 87H and the second exhaust port 88H. The exhaust-side partition member 89 has an opening at the bottom part 2CB side of the housing 2C. As described below, a mesh is attached to the opening part. The exhaust-side partition member 89 discharges the gas having discharged through the first exhaust port 87H into an outside of the exhaust-side waterproof cover 2RC through the mesh described above.

The back side part 2CSR discharges the gas through both of the first fan 87 and the second fan 88. Therefore, the gases discharged through the both fans interfere, and the efficiency of discharging of the gas from the heat radiation member storage room 2CH and from the electric parts storage room 2CE (discharge efficiency) may be lowered. The exhaust-side partition member 89 partitions a space where the first fan 87 exists and a space where the second fan 88 exists between the exhaust-side waterproof cover 2RC and the back side part 2CSR. With such a structure, the interference between the gas discharged through the first fan 87 and the gas discharged through the second fan 88 can be suppressed. Therefore, the decrease in discharge efficiency can be suppressed. As a result, the interiors of the heat radiation member storage room 2CH and of the electric parts storage room 2CE can be efficiently cooled. Especially, it is effective at quick charging because the calorific value of the power conversion unit 73 and the like is increased.

When the battery 30 included in the battery-type forklift 1 illustrated in FIG. 2 is quickly charged, the calorific value of the power conversion unit 73 of the charging device 2, especially, the calorific value of the diode 73D and the switching element 73SW at the time of switching is increased. The charging device 2 of the present embodiment can efficiently cool the devices housed in the housing 2C such as the control unit 70 and the charging device power source 71, as well as the power conversion unit 73. Therefore, it is especially favorable when the battery 30 is quickly charged.

Figure 9:
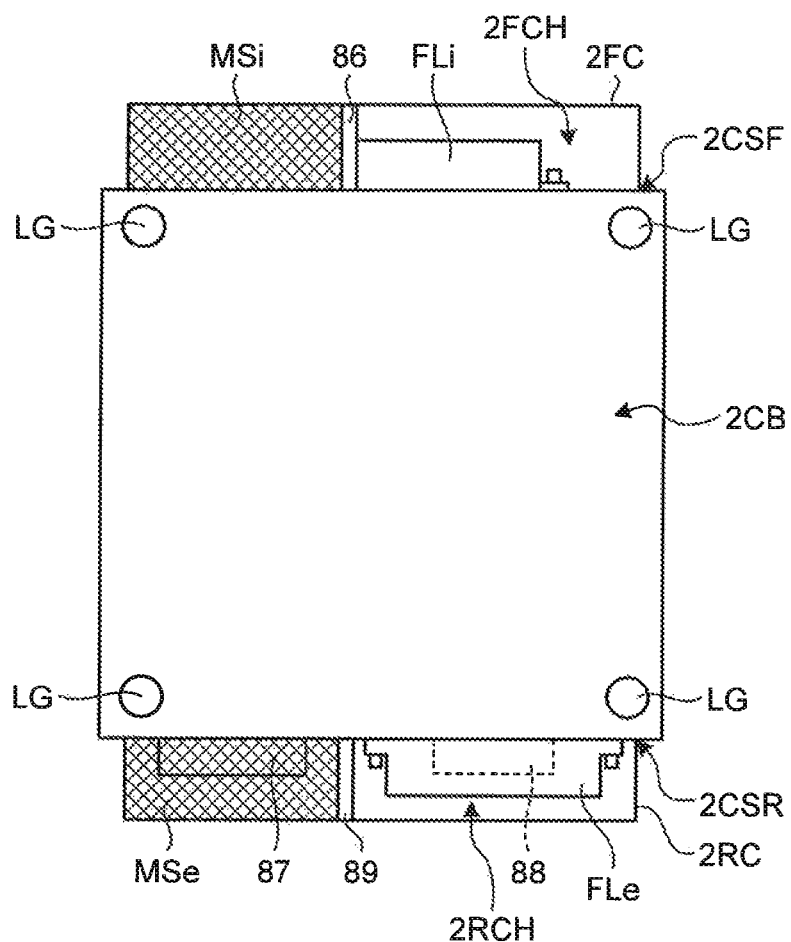
FIG. 9 is a diagram illustrating the charging device as viewed from a lower part side of a housing.
Figure 10:
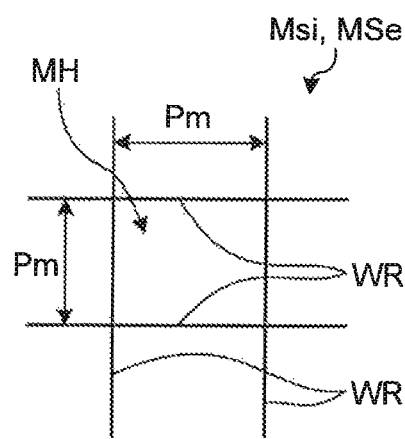
FIG. 10 is an enlarged view of a mesh.
Figure 11:
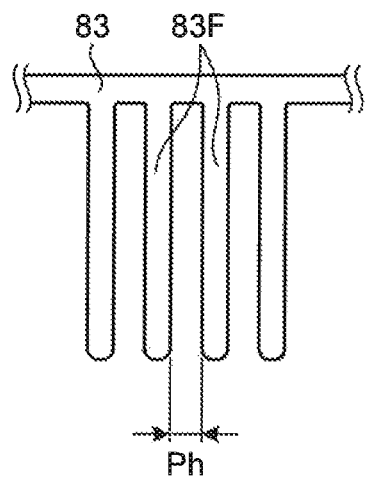
FIG. 11 is an enlarged view of a heat sink.

FIG. 9 is a diagram of the charging device as viewed from a lower part side of the housing. FIG. 10 is an enlarged view of a mesh. FIG. 11 is an enlarged view of the heat sink. The bottom part 2CB includes four legs LG. The legs LG contact with an object on which the charging device 2 is disposed. The suction-side waterproof cover 2FC and the exhaust-side waterproof cover 2RC have openings at the bottom part 2CB sides of the housing 2C. The opening at the suction-side waterproof cover 2FC side is partitioned into two parts by the suction-side partition member 86 provided outside the suction-side waterproof cover 2FC and between the suction-side waterproof cover 2FC and the front side part 2CSF. A mesh (hereinafter, referred to as suction-side mesh) MSi is provided over the opening at the first suction port 81 side illustrated in FIG. 5. An opening (hereinafter, referred to as filter-side opening) 2FCH that is not the opening at the first suction port 81 side is connected to a space where the suction-side filter FLi is provided. The filter-side opening 2FCH allows the gas at an outside of the housing 2C to pass through, and leads the gas to the suction-side filter FLi.

The suction-side partition member 86 partitions the opening at the suction-side waterproof cover 2FC side into two parts, and partitions the first suction port 81 and the second suction port 82 as illustrated in FIG. 5. With such a structure, the interference of the gases introduced into first suction port 81, and into the second suction port 82 to which the suction-side filter FLi is attached is suppressed. As a result, the suction-side partition member 86 can suppress the decrease in suction efficiency of the first suction port 81 and the second suction port 82 due to the interference of the gasses. Therefore, the electric parts attached to the heat sink 83 and the electric parts in the electric parts storage room 2CE can be efficiently cooled.

The opening at the exhaust-side waterproof cover 2RC side is partitioned into two parts by the exhaust-side partition member 89 provided between the exhaust-side waterproof cover 2RC and the back side part 2CSR. As illustrated in FIG. 9, a mesh (hereinafter, referred to as exhaust-side mesh) MSe is provided over the opening at the first exhaust port 87H, which is illustrated in FIG. 7, side. An opening that is not the opening at the first exhaust port 87H side (hereinafter, referred to as filter-side opening) 2RCH is connected to a space where the exhaust-side filter FLe is provided. The filter-side opening 2RCH allows the gas discharged through the exhaust side filter FLe to pass through, and releases the gas to an outside of the housing 2C.

The suction-side mesh MSi and the exhaust-side mesh MSe suppress intrusion of the dust and the like into the heat radiation member storage room 2CH through the first suction port 81 or through the first exhaust port 87H. If the dust and the like enter the heat radiation member storage room 2CH, the dust and the like are captured among the plurality of fins 83F included in the heat sink 83. If so, the cross sectional area between the fins 83F (an area of a cross section perpendicular to the direction into which the fin 83F extends) may be decreased. As a result, the dust and the like having entered the heat radiation member storage room 2CH becomes a resistance to the gas that flows among the fins 83F, and may decrease the cooling efficiency of the heat sink 83 by the gas.

The suction-side mesh MSi and the exhaust-side mesh MSe are, for example, netlike members made of knitted metal or resin wires WR, as illustrated in FIG. 10. Portions surrounded by adjacent wires WR are openings MH of the suction-side mesh MSi and of the exhaust-side mesh MSe. The suction-side mesh MSi and the exhaust-side mesh MSe have a plurality of openings MH. In the present embodiment, the size of the openings MH of the suction-side mesh MSi and of the exhaust-side mesh MSe is made smaller than a pitch Ph between the adjacent fins 83F of the heat sink 83 illustrated in FIG. 11. The size of the openings MH of the suction-side mesh MSi and of the exhaust-side mesh MSe is a pitch Pm of the adjacent wires WR in the present embodiment. The pitch Ph between the fins 83F is the minimum value of the distance between the adjacent fins 83F.

By causing the relationship between the pitch Pm that is the size of the openings MH of the suction-side mesh MSi and of the exhaust-side mesh MSe, and the pitch Ph between the adjacent fins 83F to be Pm<Ph, the dust smaller than the pitch Ph between the adjacent fins 83F is captured by the suction-side mesh MSi and the exhaust-side mesh MSe. As a result, the suction-side mesh MSi and the exhaust-side mesh MSe can suppress intrusion of the dust into the plurality of fins 83F included in the heat sink 83, whereby a decrease in cooling efficiency of the heat sink 83 by the gas can be suppressed.

(Control of Fan)

The on-vehicle control device 60 illustrated in FIG. 1 controls the first fan 87 and the second fan 88 through the control unit 70 of the charging device 2. For example, when the current that drives the second fan 88 is increased, it can be determined that clogging of at least one of the suction-side filter FLi and the exhaust-side filter FLe advances. When the current that drives the second fan 88 reaches a predetermined threshold value or more, the on-vehicle control device 60 may display, on the display panel 52 illustrated in FIG. 3, replacement timing of the filters, for example, indicating that the time to replace the suction-side filter FLi and the exhaust-side filter FLe has come. This enables the operator and the like of the battery-type forklift 1 to easily recognize the replacement timing of the suction-side filter FLi and the exhaust-side filter FLe.

Further, if the current that drives the first fan 87 is increased, it can be determined that the clogging of at least one of the openings MH of the suction-side mesh MSi and of the exhaust-side mesh MSe advances. When the current that drives the first fan 87 reaches a predetermined value or more, the on-vehicle control device 60 illustrated in FIG. 2 may display, on the display panel 52 illustrated in FIG. 5, the cleaning timing of the meshes, indicating that the time to clean the openings MH of the suction-side mesh MSi and of the exhaust-side mesh MSe has come. This enables the operator and the like of the battery-type forklift 1 to easily recognize the cleaning timing of the openings MH of the suction-side mesh MSi and of the exhaust-side mesh MSe.

(Details of Structure of Interior of Housing 2C)

Figure 12:
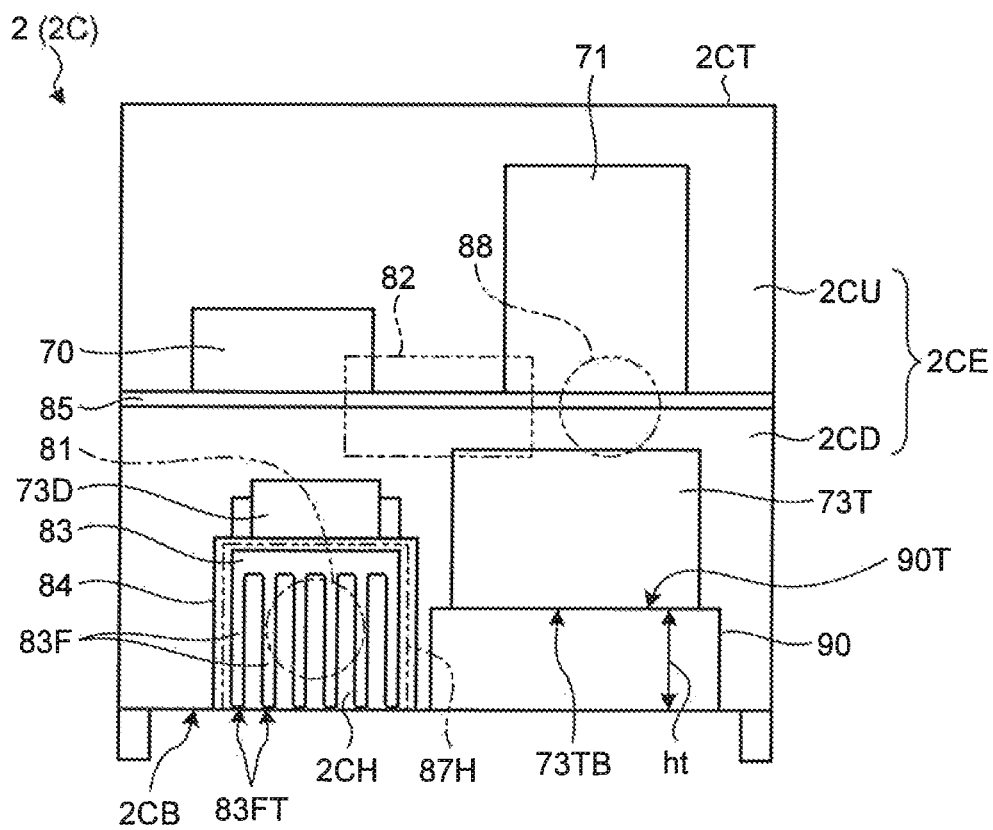
FIG. 12 is a front view illustrating an interior of the housing.
Figure 13:
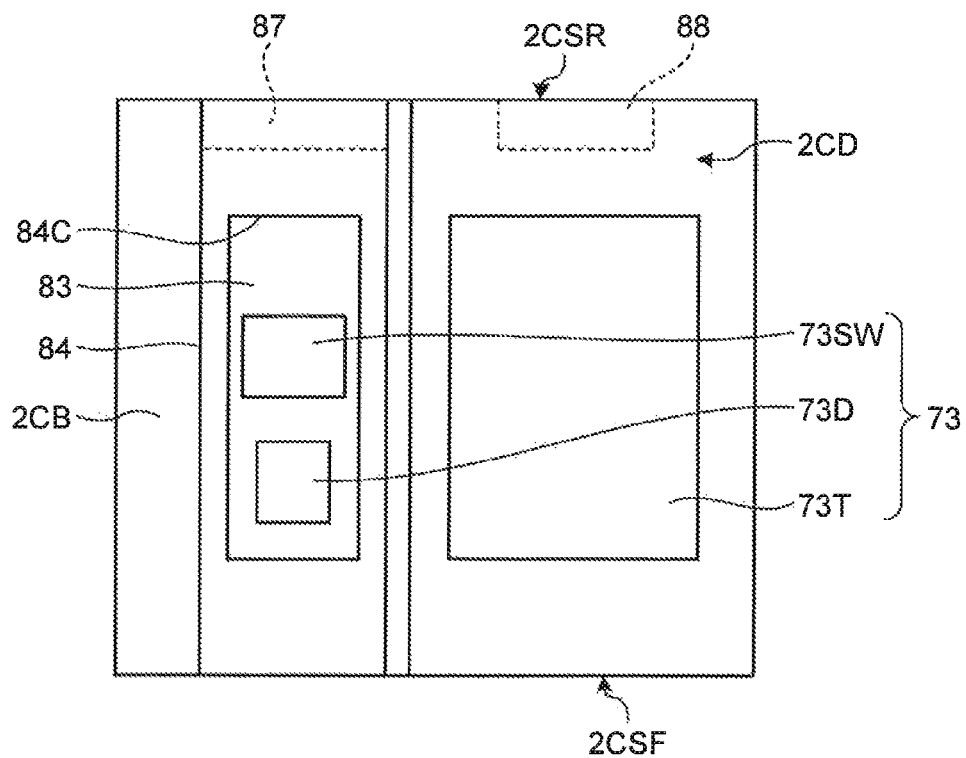
FIG. 13 is a plane view illustrating an interior of a lower storage room.
Figure 14:
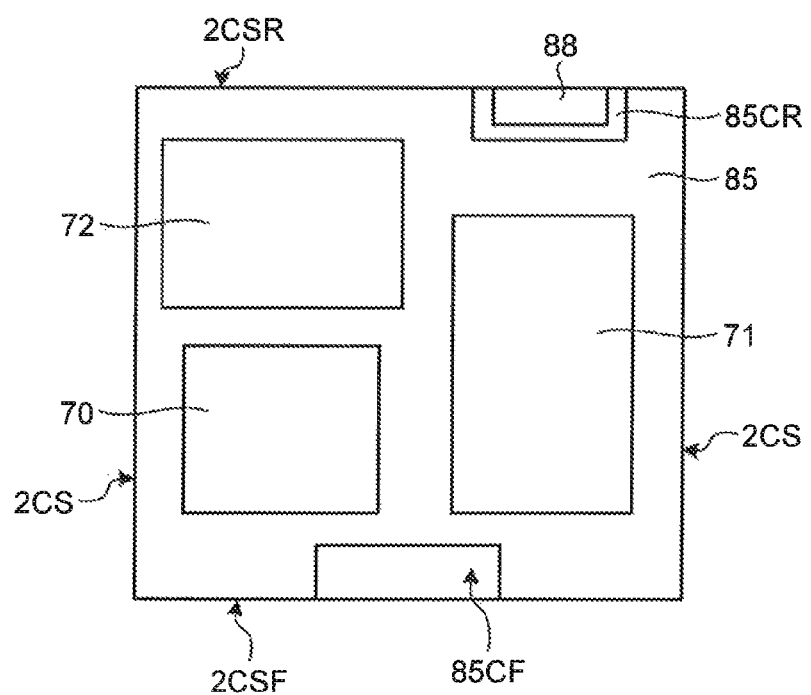
FIG. 14 is a plane view illustrating an interior of an upper storage room.

FIG. 12 is a front view illustrating the interior of the housing. FIG. 13 is a plane view illustrating an interior of the lower storage room. FIG. 14 is a plane view illustrating an interior of the upper storage room. As illustrated in FIG. 12, the end part 83FT of the plurality of fins 83F included in the heat sink 83 faces the bottom part 2CB. The positions of the electric parts attached to the heat sink 83, that is, the positions of the diode 73D and the switching element 73SW included in the power conversion unit 73 illustrated in FIG. 13 are at an upper part 2CT side than the end part of the fins 83F. With such a structure, if the water and the like are accumulated in the bottom part 2CB, the possibility that the water and the like come in contact with the diode 73D and the switching element 73SW can be decreased.

Other electric parts included in the power conversion unit 73, that is, the rectification unit 73T in the present embodiment, is arranged in the lower storage room 2CD of the electric parts storage room 2CE with a predetermined pitch between the rectification unit 73T and the bottom part 2CB. In the present embodiment, a disposition table 90 is provided on the bottom part 2CB, and a lower surface 73TB of the rectification unit 73T is attached on an upper surface 90T of the disposition table 90. The distance ht from the bottom part 2CB to the upper surface 90T of the disposition table 90 is the above-described predetermined pitch. With such a structure, even if the water and the like are accumulated in the bottom part 2CB, the possibility that the water and the like come in contact with the rectification unit 73T can be reduced.

As illustrated in FIG. 13, the duct 84 includes a notch 84C in a part thereof. The notch 84C is provided at the upper part 2CT side of the housing 2C illustrated in FIG. 12. The heat sink 83 is exposed through the notch 84C part. The diode 73D and the switching element 73SW are attached to the heat sink 83 exposed through the notch 84C. As illustrated in FIG. 13, the duct 84 is connected to the front side part 2CSF and to the back side part 2CSR. With such a structure, leakage of the gas introduced through the first suction port 81 illustrated in FIG. 12 is suppressed, and the gas can reliably flow among the fins 83F of the heat sink 83. A seal compound and the like may seal between the notch 84C and the heat sink 83. This can reliably suppress the leakage of the gas from the duct 84, whereby the gas can reliably flow among the fins 83F of the heat sink 83.

As illustrated in FIG. 12, the second suction port 82 and the second exhaust port 88H open to both of the upper storage room 2CU and the lower storage room 2CD of the electric parts storage room 2CE, with the in-housing partition member 85 in-between, as illustrated in FIG. 12. Further, as illustrated in FIG. 12, the second suction port 82 opens to an upper part 2CT side than the first suction port 81. The second exhaust port 88H opens to an upper part 2CT side than the first exhaust port 87H. Since the in-housing partition member 85 is arranged in the vicinity of a central part of the housing 2C in a height direction, the second suction port 82 and the second exhaust port 88H can be more easily opened to both of the upper storage room 2CU and the lower storage room 2CD by arranging the second suction port 82 and the second exhaust port 88H as described above. The height direction in the housing 2C is a direction from the bottom part 2CB to the upper part 2CT of the housing 2C.

The second fan 88 introduces the gas into both of the upper storage room 2CU and the lower storage room 2CD of the electric parts storage room 2CE. In the present embodiment, the second fan 88 is attached to the second exhaust port 88H, and sucks the gas from both of the upper storage room 2CU and the lower storage room 2CD of the electric parts storage room 2CE. This allows the gas to be introduced into both of the upper storage room 2CU and the lower storage room 2CD through the second suction port 82. In addition, the gas can be introduced into both of the upper storage room 2CU and the lower storage room 2CD by the single second fan 88, and therefore, the number of the second fans 88 can be decreased.

In present embodiment, as illustrated in FIG. 14, the charging device power source 71, and the control unit 70 and the startup signal generation unit 72 are arranged side by side in the width direction of the housing 2. The second fan 88 is, as illustrated in FIG. 14, provided at the charging device power source 71 side and faces the charging device power source 71. Since the second fan 88 is attached to the second exhaust port 88H, the second exhaust port 88H is also provided at the charging device power source 71 side and faces the charging device power source 71. Typically, the charging device power source 71 has a larger calorific value than the control unit 70 and the startup signal generation unit 72. In the present embodiment, as illustrated in FIG. 12, as seen from the front side part 2CSF side or the back side part 2CSR side of the housing 2C, the second suction port 82 and the second fan 88 are offset in the width direction of the housing 2, and further, the second fan 88 and the second exhaust port 88H are provided at the charging device power source 71 side. With such a structure, the gas introduced into the housing 2C through the second suction port 82 can be allowed to flow into the electric parts side having a larger calorific value. As a result, the cooling efficiency of the electric parts having relatively larger calorific values among the plurality of electric parts arranged in the housing 2C is improved.

By adjusting the sizes of the openings of the second exhaust port 88H to the upper storage room 2CU and to the lower storage room 2CD, the flow rates of the gas to be introduced into the upper storage room 2CU and into the lower storage room 2CD can be adjusted Also, by adjusting the sizes of the openings of the second suction port 82 to the upper storage room 2CU and to the lower storage room 2CD, the flow rates of the gas introduced into the upper storage room 2CU and into the lower storage room 2CD can be adjusted.

Figure 15:
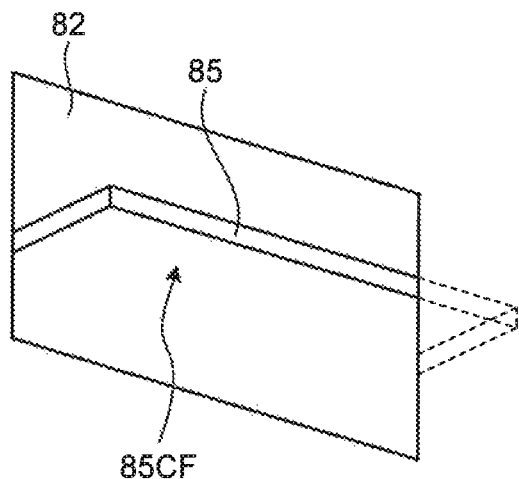
FIG. 15 is a diagram illustrating a notch included in a partition member in a housing.
Figure 16:
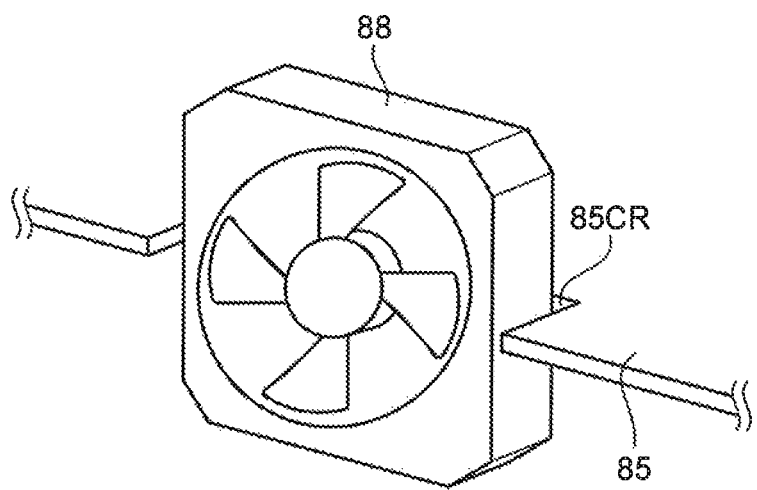
FIG. 16 is a diagram illustrating a notch included in the partition member in a housing.

FIGS. 15 and 16 are diagrams illustrating notches included in-housing partition member. As illustrated in FIG. 14, the in-housing partition member 85 mounts the control unit 70, the charging device power source 71, and the startup signal generation unit 72. The in-housing partition member 85 includes a notch 85CF and a notch 85CR at the front side part 2CSF side and the back side part 2CSR side, respectively. The notch 85CF at the front side part 2CSF side is provided at a position facing the second suction port 82, as illustrated in FIG. 15. The notch 85CR at the back side part 2CSR side is provide such that the second fan 88 is housed, as illustrated in FIG. 16. Since the second fan 88 is attached to the second exhaust port 88H, the notch 85CR at the back side part 2CSR side is provided at a position facing the second exhaust port 88H.

In a case where water enters a gap between the suction-side waterproof cover 2FC or the exhaust-side waterproof cover 2RC illustrated in FIG. 4 and the housing 2C, the water comes in contact with an outside of the front side part 2CSF or of the back side part 2CSR. The water having been in contacted with the outside of the front side part 2CSF or of the back side part 2CSR flows toward the bottom part 2CB of the charging device 2 along the front side part 2CSF or the back side part 2CSR, and drops on the disposition surface of the charging device 2. Assume that the water having entered from the gap enters the interior of the housing 2C through the second suction port 82 or through the second exhaust port 88H. The water passes through the notch 85CF at the front side part 2CSF side or through the notch 85CR at the back side part 2CSR side, and comes in contact with an inside of the front side part 2CSF or of the back side part 2CSR. The water having contacted with the outside of the front side part 2CSF or of the back side part 2CSR flows toward the bottom part 2CB of the charging device 2 along the front side part 2CSF or the back side part 2CSR, and then drops on the disposition surface of the charging device 2 from between the bottom part 2CB and the front side part 2CSF, the back side part 2CSR, or other side parts 2CS. The water having entered the housing 2C from between the front side part 2CSF or the back side part 2CSR and other side parts 2CS comes in contact with the inside of the side parts, flows toward the bottom part 2CB, and then drops on the disposition surface of the charging device 2 from between the bottom part 2CB and the front side part 2CSF, the back side part 2CSR, or other side parts 2CS.

As described above, the charging device 2 can discharge the water and the like to an outside even if the water enters the housing 2C, whereby a decrease in durability of the electric parts stored in the interior of the housing 2C can be suppressed. Note that, to efficiently discharge the water and the like having entered the housing 2C to an outside, an opening may be provided in the bottom part 2CB. This allows the water and the like having moved inside the bottom part 2CB to be easily discharged to the outside of the housing 2C through the opening.

The charging device 2 can secure the dustproof performance and the waterproof performance by the suction-side waterproof cover 2FC or the exhaust-side waterproof cover 2RC, the suction-side filter FLi and the exhaust-side filter FLe, and the suction-side mesh MSi and the exhaust-side mesh MSe. In addition, the first fan 87 cools the heat sink 83 and the second fan 88 forcibly cools the electric parts disposed in the electric parts storage room 2CE, whereby the charging device 2 can secure the cooling.

While the present embodiment has been described, the present embodiment is not limited by the above-described content. Further, the above-described configuration elements include things that can be easily conceived by a person skilled in the art, substantially the same, and so-called equivalents. Further, the above-described configuration elements may be appropriately combined. Further, various types of omission, replacement, and change of the configuration elements can be performed without departing from the gist of the present embodiment.

REFERENCE SIGNS LIST

1 Battery-type forklift
2FCH and 2RCH Filter-side opening
2 Charging device
2C Housing
2CB Bottom part
2CD Lower storage chamber
2CH Heat radiation member storage room
2CSR Side part (back side part)
2CT Upper part
2CU Upper storage chamber
2CSF Side part (front side part)
2CS Side part
2FC Waterproof cover (suction-side waterproof cover)
2RC Waterproof cover (exhaust-side waterproof cover)
2CE Electric parts storage room
6 Alternating-current power source
10 Vehicle body
13 Fork
23 Charging connector
24 Charging device-side connector
30 Battery
31 Battery case 34 Driver's seat
81 First suction port
82 Second suction port
83 Heat sink
83F Fin
83FT End part
84 Duct
85 Partition member in housing
86 Suction-side partition member
87 First fan
87H First exhaust port
88 Second fan
88H Second exhaust port
89 Exhaust side partition member
100 Working vehicle charging system
FLe Exhaust-side filter
FLi Suction-side filter
MSe Exhaust-side mesh
MSi Suction-side mesh

The invention claimed is:

1. A charging device for charging a battery, the charging device comprising:
    a housing including a bottom part, an upper part facing the bottom part, a first side part, and at least a second side part, the first side part and at least second side part connecting the upper part and the bottom part, and housing a power conversion unit configured to convert alternating-current power into direct-current power to supply the direct-current power to the battery, and a control unit configured to control the power conversion unit;
    a heat radiation member storage room in which a part of a plurality of electric parts included in the power conversion unit is attached, the heat radiation member storage room housing a heat radiation member including a plurality of fins;
    an electric parts storage room housing other electric parts of the power conversion unit and the control unit;
    a first suction port provided in the housing and configured to introduce a gas into the heat radiation member storage room, and a first exhaust port provided in the housing and configured to exhaust the introduced gas;
    a second suction port provided in the housing and configured to introduce the gas into the electric parts storage room, and a second exhaust port provided in the housing and configured to exhaust the introduced gas; and
    a first fan configured to introduce the gas into the heat radiation member storage room, and a second fan configured to introduce the gas into the electric parts storage room,
    wherein the first suction port, and the second suction port respectively open to the first side part, the first exhaust port, and the second exhaust port respectively open to the at least second side part, the second suction port opening to an upper part side of the first side part, and the second exhaust port opens to an upper part side of the at least second side part;
    wherein the plurality of fins included in the heat radiation member extends toward a direction into which the gas flows, and the charging device further includes:
    a suction-side mesh provided at a suction side of the first suction port, and having a smaller opening than a pitch between the adjacent fins;
    a suction-side partition member provided between a suction-side waterproof cover and the housing, the suction-side water proof cover covering the first suction port, the second suction port and the housing, and the suction side partition member partitioning the first suction port from the second suction port and introducing the gas that passed through the suction side mesh into the first suction port;
    an exhaust-side mesh provided at an outlet side of the first exhaust port, and having a smaller opening than a pitch between the adjacent fins; and
    an exhaust-side partition member provided between an exhaust-side waterproof cover and the housing, the exhaust-side waterproof cover covering the first exhaust port and the second exhaust port, and the exhaust-side partition member partitioning the first exhaust port from the second exhaust port and introducing the gas having discharged through the first exhaust port into the exhaust-side mesh.

2. The charging device according to claim 1, further comprising:
    an attachable/detachable suction-side filter provided at the second suction port; and
    an attachable/detachable exhaust-side filter provided at the second exhaust port.

3. The charging device according to claim 1, wherein end parts of the fins included in the heat radiation member face the bottom part, and a position at which the part of the electric parts is attached to the heat radiation member storage room at an upper part side thereof.

4. The charging device according to claim 1, wherein the other electric parts are arranged in an interior of the electric parts storage room with a predetermined pitch between the other electric parts and the bottom part.

5. The charging device according to claim 1, wherein the housing includes an in-housing partition member that partitions the electric parts storage room into an upper part side of the housing and a lower part side of the housing, and
    the second suction port and the second exhaust port open to both of the upper part side of the housing and the lower part side of the housing of the electric parts storage room, the in-housing partition member being disposed between the upper part side of the housing and the lower part side of the housing.

6. The charging device according to claim 1, wherein the first fan is provided at the first exhaust port and sucks the gas from the heat radiation member storage room, and the second fan is provided at the second exhaust port and sucks the gas from the electric parts storage room.

7. The charging device according to claim 5, wherein the second fan introduces the gas into both of the upper part side of the housing and the lower part side of the housing of the electric parts storage room.

* * * * *